United States Patent
Lehnert et al.

(10) Patent No.: US 9,840,766 B2
(45) Date of Patent: Dec. 12, 2017

(54) COMPONENT HAVING A COATING AND METHOD FOR THE PRODUCTION THEREOF

(71) Applicant: MAHLE International GmbH, Stuttgart (DE)

(72) Inventors: Monika Lehnert, Remseck (DE); Kurt Maier, Leonberg (DE)

(73) Assignee: MAHLE International GmbH, Stuttgart (DE)

( * ) Notice: Subject to any disclaimer, the term of this patent is extended or adjusted under 35 U.S.C. 154(b) by 0 days.

(21) Appl. No.: 14/437,943

(22) PCT Filed: Oct. 23, 2013

(86) PCT No.: PCT/DE2013/000626
§ 371 (c)(1),
(2) Date: Apr. 23, 2015

(87) PCT Pub. No.: WO2014/063677
PCT Pub. Date: May 1, 2014

(65) Prior Publication Data
US 2015/0240347 A1    Aug. 27, 2015

(30) Foreign Application Priority Data

Oct. 23, 2012  (DE) .................. 10 2012 020 756

(51) Int. Cl.
*C23C 14/32* (2006.01)
*C23C 14/06* (2006.01)
(Continued)

(52) U.S. Cl.
CPC ......... *C23C 14/325* (2013.01); *C10M 103/06* (2013.01); *C23C 14/06* (2013.01);
(Continued)

(58) Field of Classification Search
CPC .. C10M 103/06; C23C 14/06; C23C 14/0605; C23C 14/0664; C23C 14/14; C23C 14/325; C23C 28/042; C23C 28/42; F16J 9/26
(Continued)

(56) References Cited

U.S. PATENT DOCUMENTS 4,619,865 A * 10/1986 Keem .................... C23C 28/00
                                                  204/192.15
5,449,547 A    9/1995 Miyazaki et al.
(Continued)

FOREIGN PATENT DOCUMENTS

DE    10 2008 042 747 A1    4/2010
DE    10 2008 062 220 A1    6/2010
(Continued)

OTHER PUBLICATIONS

Langston et al. Introduction to Gas Turbines for Non-Engineers 1997.*
(Continued)

*Primary Examiner* — Aaron Austin
*Assistant Examiner* — Alicia J Sawdon
(74) *Attorney, Agent, or Firm* — Collard & Roe, P.C.

(57) ABSTRACT

The invention relates to a component having a coating containing chromium, nitrogen and carbon. According to the invention the coating comprises a sliding layer having a ceramic phase and a carbon phase, the ceramic phase forms a crystalline ceramic phase from $Cr_x(C_{1-y}N_y)$ with $0.8=x=1.2$ and $y>0.7$, and the crystalline ceramic phase and the carbon phase form a layer system of alternating individual layers (A, B), wherein the carbon phase has interstices that are filled with the crystalline ceramic phase.

14 Claims, 2 Drawing Sheets

Figure 3:
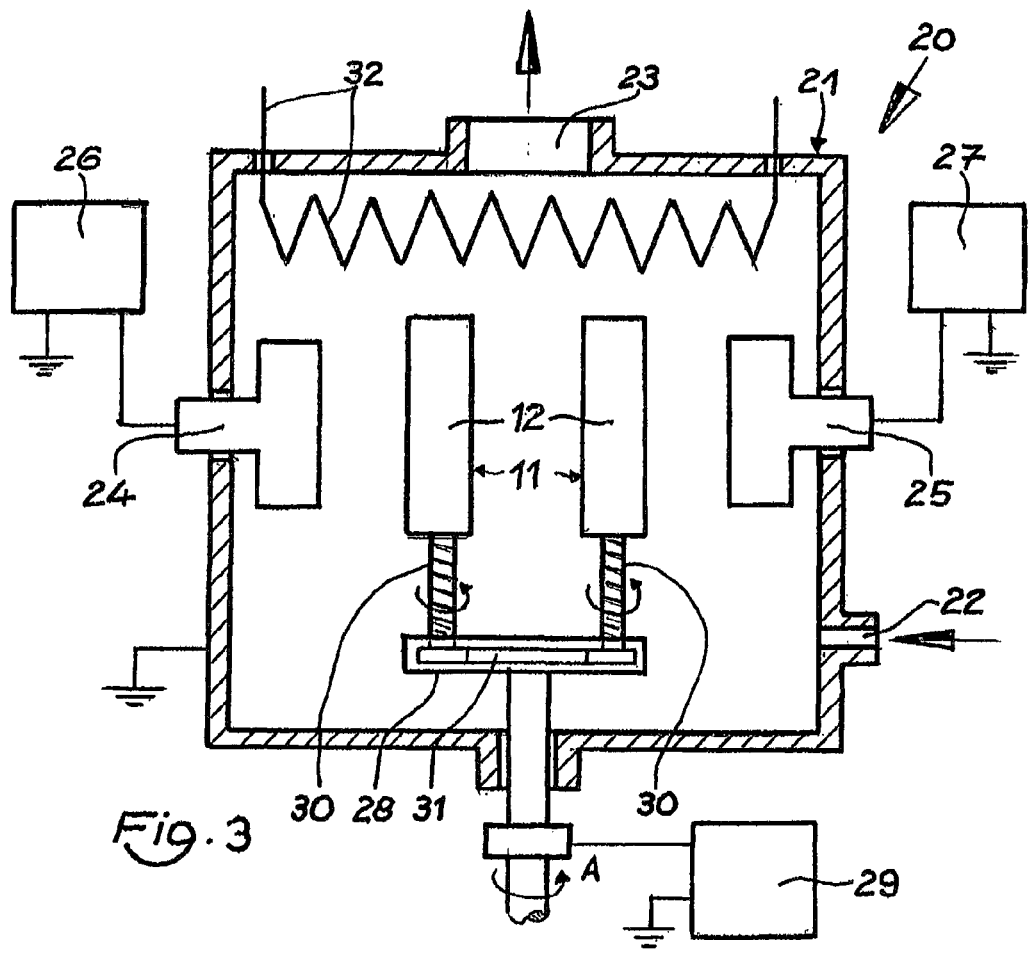

(51) Int. Cl.
*C23C 28/00* (2006.01)
*C23C 28/04* (2006.01)
*C10M 103/06* (2006.01)
*C23C 14/14* (2006.01)
*F16J 9/26* (2006.01)

(52) U.S. Cl.
CPC ...... *C23C 14/0605* (2013.01); *C23C 14/0664* (2013.01); *C23C 14/14* (2013.01); *C23C 28/042* (2013.01); *C23C 28/42* (2013.01); *F16J 9/26* (2013.01); *Y10T 428/24347* (2015.01); *Y10T 428/24355* (2015.01); *Y10T 428/24975* (2015.01); *Y10T 428/264* (2015.01); *Y10T 428/30* (2015.01)

(58) Field of Classification Search
USPC ............................................................ 428/140
See application file for complete search history.

(56) References Cited

U.S. PATENT DOCUMENTS

| | | | |
|---|---|---|---|
| 7,572,344 B2 | 8/2009 | Maier et al. | |
| 8,652,620 B2 | 2/2014 | Fischer et al. | |
| 2003/0035894 A1 | 2/2003 | Derflinger et al. | |
| 2008/0007006 A1* | 1/2008 | Kawai | C23C 14/024 277/310 |
| 2011/0268946 A1* | 11/2011 | Fischer | C23C 30/00 428/217 |
| 2012/0282461 A1 | 11/2012 | Tsuji | |
| 2013/0004756 A1* | 1/2013 | Kennedy | C23C 14/0605 428/216 |
| 2013/0280480 A1* | 10/2013 | Uihlein | C23C 28/042 428/116 |

FOREIGN PATENT DOCUMENTS

| | | | | |
|---|---|---|---|---|
| DE | 102010002686 A1 * | 9/2011 | ......... | C23C 14/0605 |
| DE | 102010060152 A1 * | 4/2012 | ........... | C23C 28/042 |
| EP | 1 136 585 A1 | 9/2001 | | |
| EP | 1 413 647 A2 | 4/2004 | | |
| EP | 2 100 807 A1 | 9/2009 | | |
| JP | 2009532581 A * | 9/2009 | | |
| JP | 2011-149035 A | 8/2011 | | |
| WO | 2005/121609 A1 | 12/2005 | | |
| WO | 2007/115419 A2 | 10/2007 | | |
| WO | WO 2007115419 A2 * | 10/2007 | ......... | C23C 14/0057 |
| WO | WO 2011000068 A1 * | 1/2011 | ......... | C23C 14/0641 |

OTHER PUBLICATIONS

DIN EN ISO 4287, Geometrical Product Specifications (GPS)—Surface textile: Profile method—Terms, definitions and surface texture parameters (ISO 4287:1997 + Cor 1:1998 + Cor 2:2005 + Amd 1:2009); German version EN ISO 4287:1998 + AC:2008 + A1:2009 and English translation of DIN EN ISO 4287: Jul. 2010.
International Search Report of PCT/DE2013/000625, dated Feb. 25, 2014.
International Search Report of PCT/DE2013/000626, dated Feb. 21, 2014.
German Search Report dated Aug. 20, 2013 in German Application No. 10 2012 020 756.5 with English translation of the relevant parts.
German Search Report dated Aug. 20, 2013 in German Application No. 10 2012 020 757.3 with English translation of the relevant parts.

* cited by examiner

COMPONENT HAVING A COATING AND METHOD FOR THE PRODUCTION THEREOF

CROSS REFERENCE TO RELATED APPLICATIONS

This application is the National Stage of PCT/DE2013/000626 filed on Oct. 23, 2013, which claims priority under 35 U.S.C. §119 of German Application No. 10 2012 020 756.5 filed on Oct. 23, 2012, the disclosures of which are incorporated by reference. The international application under PCT article 21(2) was not published in English.

The present invention relates to a component having a coating containing chromium, nitrogen, and carbon.

Coatings composed of chromium nitride, produced using PVD methods with arc vaporization, are known to a person skilled in the art. They are used, for example, on components for internal combustion engines, particularly for diesel engines. These coatings demonstrate good wear resistance and are thermally stable at the temperatures that prevail at the component during engine operation.

An important goal in the development of internal combustion engines is further reduction of fuel consumption. For this purpose, the friction losses within the internal combustion engine have to be reduced—in addition to a great number of other measures. Among other things, an aim is to reduce the friction between individual engine components during engine operation.

In DE 10 2008 062 220 A1, a two-phase coating for piston rings, composed of chromium carbide and carbon is disclosed. In this connection, the proportion of chromium carbides is supposed to amount to maximally 80 atom-%. The remainder is present in the form of graphite, as a separate phase. However, the easy fissility of graphite leads to problems with regard to the mechanical stability of the coating.

WO 2007/115419 discloses the deposition of a multi-phase layer material by means of a PVD arc method. In this connection, the layer material can consist of chromium carbide and carbon or of chromium carbonitride and carbon, however with a total carbon proportion of preferably more than 40 atom-%. Such layers do demonstrate low friction, but because of their high carbon proportion, they are mechanically relatively unstable and therefore wear rapidly.

The task of the present invention consists in further developing a component of the stated type in such a manner that its coating contributes to reducing friction, without impairing the wear resistance and the ability to withstand thermal stress.

The solution consists in that the coating has a lubricating layer having a ceramic phase and a carbon phase, that the ceramic phase forms a crystalline ceramic matrix composed of $Cr_x(C_{1-y}N_y)$ with $0.8 \leq x \leq 1.2$ and $y > 0.7$, that the crystalline ceramic phase and the carbon phase form a layer system composed of alternating individual layers, wherein the carbon phase has gaps that are filled with the crystalline ceramic phase.

An object of the invention is furthermore a method for coating a component with a lubricating layer having a ceramic phase and an amorphous phase, wherein at least one component is mounted on a spindle disposed on a turntable, so as to rotate, in a vacuum chamber. According to the invention, the lubricating layer is applied by means of a PVD method with arc vaporization, wherein the following parameters are used. At least one metal target and at least one carbon target serve as material sources, wherein the ratio of the target streams of metal to carbon amounts to 2 to 7. The deposition temperature at the component amounts to 350° C. to 500° C. The bias voltage amounts to −50 V to −150 V. The pressure in the vacuum chamber amounts to 0.2 Pa to 1.0 Pa. The atmosphere in the vacuum chamber is composed of nitrogen and inert gas having a ratio of the nitrogen partial pressure to the total pressure of 0.6 to 1.0. During the coating process, the rotation of the turntable amounts to 20-40 revolutions per minute, while the rotation of the at least one spindle amounts to 5-7 revolutions per revolution of the turntable.

The lubricating layer provided according to the invention is characterized by several special features.

Multi-phase lubricating layers can be present either in the form of a laminate structure or in the form of a polycrystalline mixture. Carbon (or its dichalcogenides) is selected as one of the phases of the lubricating layer. For lubricating bodies for which both a low friction coefficient and great mechanical stability are required, the following problem occurs in this connection.

If a laminate structure composed of carbon and a ceramic material is selected, the material having the lower shear resistance will always lie at the surface during use, because the ceramic phase is pulled off during friction contact. This phase has insufficient mechanical properties for numerous applications, which can reach so far that the wear resistance of the laminate structure composed of carbon and ceramic material is lower than the wear resistance of pure carbon layers. It is true that the goal of a layered material having a low friction coefficient is reached, but the goal of good mechanical properties is not met.

If a polycrystalline mixture of carbon and a ceramic material is selected, then the resulting lubricating layer can be built up homogeneously from two phases if the proportion of the two phases amounts to 40 to 60 atom-%, in each instance. In this homogeneous lubricating layer material, the mechanical properties such as the impact resistance are substantially determined by the weaker partner, while the hardness represents a mixed hardness. Because carbon is very brittle, it is not possible to achieve sufficient abrasive wear with these layers.

However, the resulting lubricating layer can also be built up in the form of a matrix having embeddings. This structure is obtained with phase proportions outside of the range mentioned above. If the proportion of the ceramic phase lies below 40 atom-%, a carbon matrix with embedded ceramic particles is obtained. If the proportion of the ceramic phase lies above 60%, a ceramic matrix with embedded carbon particles is obtained. Only structures having a ceramic matrix are suitable for lubricating layers. In this connection, it has been shown that at a carbon proportion of more than 10 atom-%, the impact resistance of the lubricating layer decreases greatly. At this composition and morphology, the friction coefficient is lowered by approximately the volume percentage of the carbon. Such a low gain misses the goal of a low-friction layer.

The novel structure of the lubricating layer according to the invention is characterized in that the individual layers of the carbon phase have gaps, so that the structure of the individual layers is like that of a perforated metal sheet. These gaps are filled with crystalline ceramic material. This anisotropic structure of the individual layers of the carbon phase leads to the result that during friction contact, surfaces that are covered by carbon, to a great extent, are formed. At the same time, the crystalline ceramic material ensures good values for impact resistance and hardness of the lubricating layer provided according to the invention.

The lubricating layer according to the invention is therefore characterized by a low friction coefficient at simultaneously great mechanical stability.

Both phases are substantially free of hydrogen. This brings about great thermal stability of the lubricating layer provided according to the invention.

Advantageous further developments are evident from the dependent claims.

It preferably holds true for the crystalline ceramic matrix composed of $Cr_x(C_{1-y}N_y)$ that $0.9 \leq x \leq 1.1$ and $y > 0.8$.

Preferably, the crystalline ceramic phase forms bridges between its individual layers, which connect the individual layers of the crystalline ceramic phase with one another. In this manner, the mechanical stability of the lubricating layer is further improved.

A preferred further development provides that the crystalline ceramic phase and the carbon phase are present in the form of lamellae. In this connection, the carbon phase can have a structure in which the lamellae are disposed substantially parallel to the surface of the lubricating layer. As a result, the friction coefficient is further lowered.

The lubricating layer preferably has a total carbon content of 8-27 atom-%, particularly preferably of 12-20 atom-%. An overly low carbon content leads to an overly low friction coefficient. An overly high carbon content impairs the mechanical stability of the lubricating layer of the component according to the invention.

The thickness of the lubricating layer can amount to 1 to 50 μm, preferably 10 to 30 μm. These comparatively large thicknesses can be prepared because the inherent stresses of the lubricating layer of the component according to the invention are relatively low. Preferably, the thickness of the individual layers amounts to 1.0 nm to 4.0 nm.

The Vickers hardness of the lubricating layer preferably amounts to 2000-3000 HV 0.05 and/or the modulus of elasticity of the lubricating layer amounts to 200-300 GPa, in order to optimize its wear resistance.

The lubricating layer preferably has an average roughness depth Rz of less than 1 μm and/or a material proportion Rmr(02) of more than 50% and/or a material proportion of Rmr(03) of more than 70%. Because the ceramic phase is relatively hard, the surface of the lubricating layer should have as few irregularities as possible, which would have an abrasive effect on the counter-body in a tribological system. The definition and the determination of the material proportion Rmr are established in the standard DIN EN ISO 4287.

The basic body of the component can consist of cast iron or steel, for example.

Preferably, an adhesion layer composed of a metallic material is provided between the basic body and the lubricating layer. This layer consists of a metal or a metal alloy, for example molybdenum, chromium, titanium, tungsten or chromium-aluminum alloy. The adhesion layer serves for optimizing the adhesion of the subsequent layers on the basic body.

Preferably, an intermediate layer composed of a metal nitride material, for example chromium nitride, molybdenum nitride, titanium nitride or chromium aluminum nitride, is provided between the adhesion layer and the lubricating layer. The intermediate layer functions as a diffusion barrier. It prevents diffusion of carbon into the adhesion layer. If carbon were to diffuse into the adhesion layer, the formation of brittle metal carbides would occur at the boundary zone of the two layers. This would result in mechanical instability.

The adhesion layer and the intermediate layer each preferably have a thickness of 0.5 to 4 μm. These thicknesses are completely sufficient, so that an overly high end weight of the component according to the invention is avoided.

The component according to the invention is preferably a component for an internal combustion engine, for example a piston ring, a piston pin, a cam of a camshaft, a valve, a valve tappet or a rocker arm.

Figure 1:
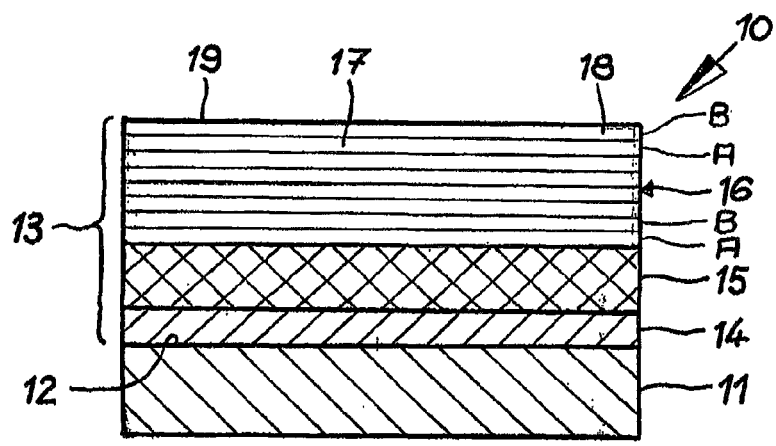
Figure 2:
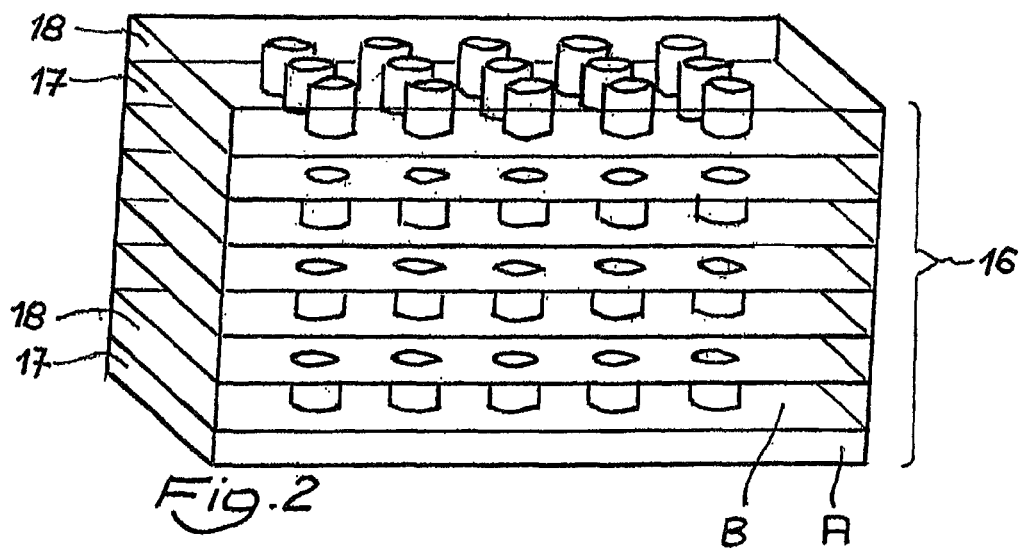
Figure 4:
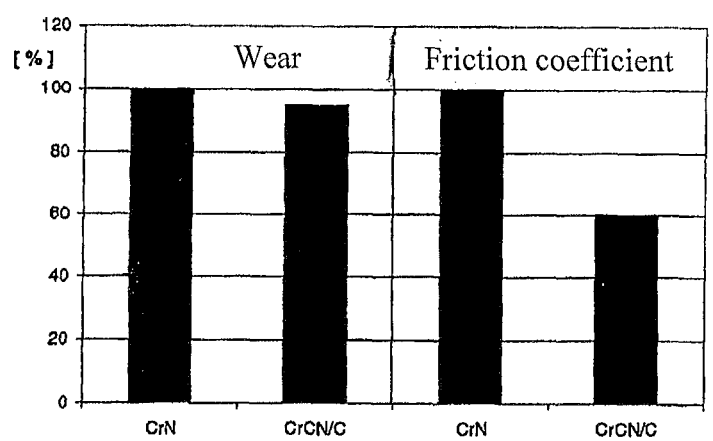

In the following, the invention will be explained in greater detail using the attached drawings. These show, in a schematic representation, not true to scale:

FIG. 1 an exemplary embodiment of a component coated according to the invention, in section;

FIG. 2 the lubricating layer of the component according to FIG. 1 in a perspective representation;

FIG. 3 an exemplary embodiment of an apparatus for coating the component according to FIG. 1;

FIG. 4 a bar diagram of a wear test of a component coated according to the invention and of a comparison component.

FIGS. 1 and 2 show a schematic representation of an exemplary embodiment of a component 10 coated according to the invention, for an internal combustion engine, for example a piston ring, a piston pin, a cam of a camshaft, a valve, a valve tappet or a rocker arm. The component 10 has a basic body 11 having a coated surface 12. The basic body 11 generally consists of steel or cast iron. The surface 12 can be nitrided in known manner before being coated. To produce a coating 13, in the exemplary embodiment an adhesion layer 14 composed of chromium is applied to the surface 12 in known manner, for example by means of a PVD method. An intermediate layer 15, which consists of chromium nitride in the exemplary embodiment, is applied to the adhesion layer 14. The intermediate layer can also be produced in known manner, by means of a PVD method.

According to the invention, a lubricating layer 16 is applied to the intermediate layer 15. The lubricating layer 16 has a crystalline ceramic phase 17 and a carbon phase 18. The crystalline ceramic phase 17 consists of chromium carbonitride $Cr_x(C_{1-y}N_y)$, wherein $0.8 \leq x \leq 1.2$ and $y > 0.7$. The carbon phase 18 consists, at least in part, of graphite, the lattice planes of which are disposed parallel to the surface 19 of the lubricating layer 16. The crystalline ceramic phase 17 and the carbon phase 18 are present in alternating layers A, B, wherein the layers A are formed by the crystalline ceramic phase 17 and the layers B are formed by the carbon phase 18. Each of the layers A, B, has a thickness between 0.5 μm and 4.0 μm. A layer B formed of the carbon phase 18 represents the surface 19 of the lubricating layer 16.

To produce the coating 13, particularly the lubricating layer 16, a PVD method with arc vaporization is used. FIG. 3 schematically shows a coating system 20, as it can be used to carry out this method. The structure of this coating system will be described below.

The coating system 20 according to FIG. 3 has a vacuum chamber 21, which has a gas inlet opening 22 and an exhaust opening 23.

An electrical heating device 32 is affixed to the walls of the vacuum chamber 21. The vacuum chamber 21 itself lies electrically at ground.

Two targets 24, 25 are disposed in the vacuum chamber 21. The first target 24 consists of metallic chromium and is connected with the cathode of a current source 26 to produce an arc. The second target 25 consists of carbon in the form of graphite and is also connected with the cathode of a current source 27 to produce an arc. The targets 24, 25 are disposed in such a manner that they are at an equal distance from the surface 12 to be coated of the basic body 11 of the component to be coated. If the vacuum chamber 21 is correspondingly large, a group of targets can be provided in place of an individual target 24, 25, in each instance, wherein the spatial arrangement must be configured in such a manner that the ion flow proceeding from the targets is spatially homogeneous, to a great extent.

A turntable 28 that can rotate about the arrow A is disposed in the center of the vacuum chamber 21 and is electrically connected with a current source 29 for producing the bias voltage. The turntable 28 has multiple spindles 30, disposed in circular shape around its center point. The basic bodies 11 to be coated are fastened onto the spindles 30. The spindles 30 are mounted so as to rotate and are driven by the turntable 28 by way of a planetary gear mechanism 31 provided in its interior. The translation ratio of the planetary gear mechanism amounts to 5 to 7.

In the following, the principle of a PVD coating method using arc vaporization will be described.

After the basic bodies 11 to be coated are mounted on the spindles 30, the vacuum chamber 21 is closed and the pressure in the vacuum chamber 21 is reduced to 0.03 Pa or less, in that gas is pumped out through the exhaust opening 23. At the same time, the heating device 32 is put into operation. The heating device 32 brings about degassing, i.e. the release of gases that are absorbed on the inner wall of the vacuum chamber 21 and on the basic bodies 11 to be coated. After pumping out and heating have taken place, the turntable 28 is put into rotation and a noble gas, generally argon, is introduced into the vacuum chamber 21 through the gas inlet opening 22. Now the targets 24 composed of chromium are put into operation. A negative bias voltage of −800 to −1200 volts is applied by way of the current source. The chromium ions emitted by the targets 24 in turn ionize the argon gas. By means of the high bias voltage, the ions are accelerated greatly, impact the basic bodies 11 at a high kinetic energy, and strike the uppermost atom layers, which typically consist of oxides, out of the surface 12 of the basic bodies 11. In this way, cleaning of the surfaces 12 to be coated of the basic bodies 11 is carried out by means of ion bombardment. This process is also referred to as ion etching.

Afterward, the bias voltage is set to a low value, the argon pressure is increased slightly, and the current feed to the targets 24 composed of chromium is increased. Under these conditions, more chromium ions are deposited onto the cleaned surface 12 of the basic body 11 than are etched off by means of the ion bombardment. These remaining chromium ions form a metallic chromium layer as an adhesion layer 14.

After some time, at a constant current feed to the targets 24 composed of chromium and at a continuing low bias voltage, the argon is replaced with nitrogen. Nitrogen represents a reactive gas. Within the plasma that is burning in the chamber, the N—N bond of the nitrogen molecules is broken up. The free nitrogen atoms react with the chromium ions. The reaction product is deposited on the surface of the adhesion layer 14 as an intermediate layer 15 in the form of chromium nitride.

To ensure good adhesion of the lubricating layer to be formed on the intermediate layer 15 composed of chromium nitride, in the next step intermediate etching by means of ion bombardment is carried out under the conditions described above.

Afterward, the lubricating layer 16 is deposited. For this purpose, nitrogen and argon are introduced into the vacuum chamber 21 and both the targets 24 composed of chromium and the targets 25 composed of carbon are put into operation. The bias voltage is increased to a slight extent.

The turntable 28 is put into fast rotation of 20-40 revolutions per minute. This is necessary in order to achieve the low layer thicknesses of the individual layers A, B. If the individual layers are overly thick, the bridges composed of the crystalline ceramic phase that connect the individual layers A cannot build up.

The ratio of the cathode current for the targets 24 composed of chromium to the cathode current for the targets 25 composed of carbon is decisive for adjusting the total carbon content according to the invention. This ratio amounts to 2 to 7, preferably 3 to 5.

The composition of the crystalline ceramic phase 17 is substantially controlled by means of the nitrogen partial pressure. A high nitrogen partial pressure leads to a high nitrogen content in the crystalline ceramic phase 17. The ratio of nitrogen partial pressure to total pressure should amount to 0.6 to 1.0, preferably 0.7 to 0.9.

It is also possible to carry out the deposition of the lubricating layer 16 with neon in place of argon. Neon has a lower atomic mass than argon. This has an effect on the effect known as "resputtering." "Resputtering" means that the layer to be deposited is constantly bombarded by inert gas ions during its formation, which ions wear away part of the layer particles, particularly particles that are bound in less strongly. The sputter rate now depends on the mass of the inert gas ions. The light neon ions have a high sputter rate with regard to carbon and a lower sputter rate with regard to chromium or chromium carbonitride, while the conditions are the opposite for the heavier argon ions. With neon as the inert gas, resputtering of carbon can therefore be increased in comparison with resputtering of chromium or chromium carbonitride, and thus the amount proportion of the embedded carbon particles can be reduced. Furthermore, embedded neon leads to lower inherent stresses than embedded argon.

The lubricating layer 16 has moderate internal stresses under suitable deposition conditions and can therefore be deposited in layers having a thickness of up to 50 μm.

When the desired layer thickness has been reached, the electrical currents, the heating, as well as the gas feed are turned off, and the vacuum chamber 21 including its contents are allowed to cool off. Afterward, the vacuum chamber 21 can be opened and the coated components 10 can be removed.

As is usual for PVD coating by means of arc vaporization, the surface of the lubricating layer 16 has a relatively high roughness in the deposited state, which is unsuitable for tribological uses. For this reason, a final finishing process is undertaken. This process can take place, depending on the geometry of the components 10, by means of grinding, honing, lapping or a combination of these methods. It is essential to produce a smooth surface having a high contact ratio.

In the following, an exemplary embodiment of the present invention will be described.

Piston rings composed of nitrided steel and having a trapezoid cross-section are used. Such piston rings and their production are known, for example from WO 2005/121609 A1. Before being coated, the piston rings are carefully cleaned, using an aqueous method, and dried. Afterward, they are arranged in cylindrical stacks, fixed in place using an auxiliary apparatus, and set onto the corresponding places of the turntable 28 as spindles 30.

The turntable 28 is moved into the vacuum chamber 21 and the latter is then closed. Afterward, the vacuum chamber 21 is evacuated to a final pressure of 0.03 Pa and heated to a temperature of 420° C. This takes 90 to 120 minutes. If the heating temperature is too low, degassing is incomplete. If the heating temperature is too high, the piston rings can be deformed.

This temperature is maintained until the start of deposition of the lubricating layer 16.

The first ion etching takes place at a bias voltage of −900 volts and an argon pressure of 0.08 Pa. The targets 24 composed of chromium are intermittently operated over a total time of 12 minutes, namely for 30 seconds at a total current of 90 A, followed by a pause of 30 seconds. The relatively low anode current and the pauses serve to prevent overly strong heating of the piston rings. This would lead not only to deformation of the piston rings but also to denitration of the edge zone close to the surface, which would reduce the adhesion of the subsequent adhesion layer 14 composed of chromium. An overly high bias voltage would also heat the piston rings too strongly. Vice versa, an overly low bias voltage would not bring about a satisfactory cleaning result.

The adhesion layer 14 composed of chromium is then deposited under argon pressure of 2 Pa, bias voltage of −50 volts, and a anode current of 480 A. An adhesion layer 14 having a thickness of approximately 1.5 μm is formed within 60 minutes.

Under the same conditions, only under nitrogen pressure of 2 Pa in place of the argon, the intermediate layer 15 composed of chromium nitride is subsequently formed. An intermediate layer 15 having a thickness of approximately 3 μm is formed within 90 minutes. This intermediate layer 15 functions as a diffusion barrier, among other things. If the lubricating layer 16 were to be deposited directly onto the metallic adhesion layer 14 composed of chromium, then carbon would diffuse into the chromium layer. Chromium carbides would form in the boundary zone, and these would lead to adhesion problems. The intermediate layer 15 composed of chromium nitride prevents such diffusion and allows good adhesion, able to withstand mechanical stress, of the lubricating layer 16 applied to it.

A further improvement in adhesion is achieved if deposition of the intermediate layer 15 composed of chromium nitride is followed by renewed ion etching, which is carried out under the same conditions as described above. By means of this ion etching, chromium nitride particles that lie only loosely on the surface and therefore can impair adhesion are removed.

To deposit the lubricating layer 16, not only the targets 24 composed of chromium but also the targets 25 composed of carbon are put into operation. The following conditions are adjusted:

| | |
|---|---|
| Total anode current for the chromium targets: | 600 A |
| Total cathode current for the carbon targets: | 150 A |
| Bias voltage: | −150 V |
| Total pressure: | 0.4 Pa |
| Ratio of the partial pressures of nitrogen and argon: | 0.8 |
| Speed of rotation of the turntable: | 30 rpm |
| Temperature of the components to be coated: | 470° C. |

In 7 hours, a lubricating layer 16 having a thickness of approximately 20 μm is deposited.

The measurement of the Vickers hardness HV 0.05 of the lubricating layer 16 according to the invention was carried out in known manner and yielded a value of 1600 HV 0.05. The modulus of elasticity of the lubricating layer 16 according to the invention was determined by means of the known load penetration method. This yielded a value of 150 GPa.

Final machining of the piston rings takes place with a combination of fine-grinding and lapping. For fine-grinding, a corundum grinding paper having a grain size of 500 is used. This is followed by lapping using diamond paste having a grain size of 0.5 μm.

Evaluation of the surface characteristic values according to DIN EN 4287 yielded an averaged roughness depth Rz of 0.08, a value for the material proportion Rmr 02 of 62%, and a value for the material proportion Rmr 03 of 89%.

The layer structure was investigated by means of high-resolution transmission electron microscopy. In the bright-field image of the lubricating layer 16, it was possible to recognize a continuous sequence of lamellae, wherein CrCN lamellae alternate with carbon lamellae and thereby form a sequence of individual layers ABAB. A further variation of the carbon content is superimposed on this lamellae structure, so that the lubricating layer 16 has CrCN lamellae having a higher carbon content and CrCN lamellae having a lower carbon content. When looking more closely, it was possible to see that the carbon lamellae appear to consist of individual carbon particles and small CrCN crystals. However, since this was a microsection, the carbon particles are an image of the carbon lamella interspersed with small CrCN crystals. A dark-field image of carbon or graphite in the same region of the lubricating layer 16 once again showed the CrCN lamellae and the carbon lamellae. Once again, the carbon lamellae were images as carbon particles, which were interrupted by zones having a lower carbon content, which were regions having a high chromium concentration, in other words small CrCN crystals.

In a comparison test, a piston ring having a conventional chromium nitride layer was used as a comparison example; this ring is produced in a manner similar to that of the exemplary embodiment. Piston rings composed of nitrided steel were cleaned as described above, placed into the vacuum chamber 21, etched, and provided with an adhesion layer composed of chromium. The chromium nitride layer was deposited under the same conditions as for the exemplary embodiment. Only the coating time was increased to 10 hours. In this connection, a chromium nitride layer having a thickness of 20 μm and a Vickers hardness of approximately 1200 HV 0.05 was formed. This layer was finish-machined in analogous manner as described above, by means of fine-grinding and lapping.

To measure the wear resistance of the piston rings according to the exemplary embodiment and according to the comparison example, a known tribometer was used, which produced reversible sliding wear. Segments of a piston ring coated according to the invention, having lubricating layers according to FIG. 1, and segments of a piston ring coated according to the comparison example were used as test parts. Segments of a corresponding honed cylinder composed of lamellar cast iron were used as counter-bodies. With this test setup, the movement of the piston rings in the cylinder was reproduced, specifically in the wear-relevant region of the upper reversal point. Accordingly, the test conditions were selected in such a manner that during slower movement and the lowest supply of lubrication oil, a high load and therefore a high surface pressure acted on the test setup, in accordance with the gas pressure to which the piston ring is subject during engine operation. The test conditions were, in detail:

| | |
|---|---|
| Test duration: | 12 hours |
| Load | 1,200N |
| Surface pressure: | 57N/mm$^2$ |
| Stroke: | 4 mm |
| Speed: | 1.33 m/min |
| Frequency: | 5 Hz |

-continued

| Lubrication: | 0.036 g every 2 hours |
| Oil: | motor oil 5 W 40 |
| Temperature: | 20° C. |

During the wear test, the friction forces that occurred were measured and the friction coefficients were calculated from them. After the test, the wear depth on the piston rings and the counter-bodies was evaluated. These were very low, in part, so that a white-light interferometer was used to determine the profile depth.

In the evaluation of the measurement results, the pairing of chromium nitride-lamellar cast iron serves as a comparison example according to the state of the art, and as a reference for standardization of the data. The resulting FIG. 4 shows the comparison of the values for wear and friction as a bar diagram. From this, it can be seen that the lubricating layer 16 according to the invention demonstrates somewhat improved wear resistance and a clearly reduced friction coefficient as compared with a conventional chromium nitride layer.

The invention claimed is:

1. A component (10) having a coating (13) containing chromium, nitrogen, and carbon, wherein the coating (13) has a lubricating layer (16) having a ceramic phase (17) and a carbon phase (18), wherein the ceramic phase (17) forms a crystalline ceramic phase composed of $Cr_x(C_{1-y}N_y)$ with $0.8 \leq x \leq 1.2$ and $y > 0.7$, wherein the crystalline ceramic phase (17) and the carbon phase (18) form a layer system composed of alternating individual layers (A, B), wherein the carbon phase (18) has gaps that are filled with the crystalline ceramic phase (17), wherein the lubricating layer (16) has a total carbon content of 12 to 20 atom-%, and wherein the crystalline ceramic phase does not have gaps that are filled with the carbon phase.

2. The component according to claim 1, wherein it holds true for the crystalline ceramic matrix (17) composed of $Cr_x(C_{1-y}N_y)$: $0.9 \leq x \leq 1.1$ and $y > 0.8$.

3. The component according to claim 1, wherein the crystalline ceramic phase (17) forms bridges between its individual layers (A).

4. The component according to claim 1, wherein the crystalline ceramic phase (17) and the carbon phase (18) are present in the form of lamellae.

5. The component according to claim 4, wherein the lamellae of the carbon phase (18) are disposed parallel to the surface (19) of the lubricating layer (16).

6. The component according to claim 1, wherein the thickness of the lubricating layer (16) amounts to 1 to 50 µm.

7. The component according to claim 1, wherein the thickness of each individual layer (A, B) amounts to between 1.0 nm and 4.0 nm.

8. The component according to claim 1, wherein the Vickers hardness of the lubricating layer (16) amounts to 1000 HV to 2000 HV 0.05.

9. The component according to claim 1, wherein the modulus of elasticity of the lubricating layer (16) amounts to 100 GPa to 200 GPa.

10. The component according to claim 1, wherein the lubricating layer (16) has an average roughness depth Rz of less than 1 µm at its surface and/or that the material proportion Rmr(02) amounts to more than 50% and/or that the material proportion Rmr(03) amounts to more than 70%.

11. The component according to claim 1, wherein an adhesion layer (14) composed of a metallic material is applied between a body (11) of the component and the lubricating layer (16).

12. The component according to claim 11, wherein an intermediate layer (15) composed of a metal nitride material is applied between the adhesion layer (14) and the lubricating layer (16).

13. The component according to claim 1 for an internal combustion engine, wherein the component is a piston ring, a piston pin, a cam of a camshaft, a valve, a valve tappet or a rocker arm.

14. A method for coating a component (10) with the lubricating layer (16) of claim 1, wherein at least one component (10) is mounted on a spindle (30) disposed on a turntable (28), so as to rotate, in a vacuum chamber (21), wherein for the production of the lubricating layer (16), a PVD method with arc vaporization, having the following parameters, is used:
Material sources: at least one metal target (24) and at least one carbon target (25);
Ratio of the target streams of metal to carbon: 2 to 7;
Deposition temperature at the component (10): 350° C. to 500° C.;
Bias voltage: −50 V to −150 V;
Pressure in the vacuum chamber: 0.2 Pa to 1.0 Pa;
Atmosphere in the vacuum chamber: nitrogen and inert gas having a ratio of the nitrogen partial pressure to the total pressure of 0.6 to 1.0;
Rotation of the turntable (28): 20 to 40 revolutions per minute;
Rotation of the at least one spindle (30): 5 to 7 revolutions per revolution of the turntable (28).

* * * * *